(12) United States Patent
Nerone

(10) Patent No.: US 8,513,854 B1
(45) Date of Patent: Aug. 20, 2013

(54) PIEZOELECTRIC DRIVER

(75) Inventor: Louis Robert Nerone, Brecksville, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/434,211

(22) Filed: Mar. 29, 2012

(51) Int. Cl.
*H01L 41/08* (2006.01)

(52) U.S. Cl.
USPC ...................... 310/316.01; 310/317

(58) Field of Classification Search
USPC ..................... 310/317, 319, 316.01
See application file for complete search history.

(56) References Cited

U.S. PATENT DOCUMENTS

| | | | | |
|---|---|---|---|---|
| 3,584,244 A | * | 6/1971 | Vest | 310/316.01 |
| 3,742,492 A | * | 6/1973 | Proctor | 340/384.6 |
| 6,064,138 A | * | 5/2000 | Iino et al. | 310/316.01 |
| 6,268,681 B1 | * | 7/2001 | Yamaguchi et al. | 310/316.01 |
| 6,371,587 B1 | * | 4/2002 | Chang | 347/11 |
| 6,522,048 B1 | * | 2/2003 | Burns et al. | 310/316.01 |
| 6,995,496 B1 | * | 2/2006 | Hagood et al. | 310/317 |
| 7,622,872 B2 | * | 11/2009 | Nishio | 318/127 |

* cited by examiner

*Primary Examiner* — Mark Budd
(74) *Attorney, Agent, or Firm* — Pearne & Gordon LLP

(57) ABSTRACT

A driver circuit includes an inverter having a controlled switch with an input for controlling switching operations. A tuned circuit has a resonant frequency when connected to a resonant load. The tuned circuit receives inverter output and generates a driving signal. Frequency of the inverter output and frequency of the driving signal substantially equal the resonant frequency of the tuned circuit. The tuned circuit boosts the inverter output to generate the driving signal such that a voltage of the driving signal is greater than a voltage of the inverter output. A feedback portion receives the inverter output and phase-shifts it to generate an inverter control signal. The feedback portion provides the inverter control signal to the input of the controlled switch to control switching operations of controlled switch. The driver self-oscillates at the resonant frequency due to the feedback portion phase-shifting the inverter output to generate the inverter control signal.

20 Claims, 2 Drawing Sheets

PIEZOELECTRIC DRIVER

BACKGROUND OF THE INVENTION

1. Field of the Invention

The present invention relates to driver circuits for piezoelectric devices, such as piezoelectric fans.

2. Description of Related Art

It is known to drive a piezoelectric device at a resonant frequency to cause it to oscillate. Driver circuits are tuned to the resonant frequency, such as by manually adjusting a trimming potentiometer in the driver circuit. Adjusting the frequency manually takes time and can cause the amplitude of the driving signal to change as the frequency of the driving signal is adjusted. Thus, it might be difficult to obtain a desired amplitude and frequency using a driver circuit that must be tuned to the appropriate resonant frequency.

BRIEF SUMMARY OF THE INVENTION

In accordance with one aspect of the present invention, provided is a driver circuit for driving a resonant load. The driver circuit comprises an inverter portion that generates an inverter output signal. The inverter portion includes a controlled switch, wherein the controlled switch comprises a control input for controlling switching operations of the controlled switch. A tuned circuit portion has a resonant frequency when connected to the resonant load. The tuned circuit portion receives the inverter output signal and generates a resonant load driving signal from the inverter output signal. A frequency of the inverter output signal and a frequency of the resonant load driving signal at least substantially equal the resonant frequency of the tuned circuit portion. The tuned circuit portion boosts the inverter output signal to generate the resonant load driving signal such that an RMS voltage level of the resonant load driving signal is greater than an RMS voltage level of the inverter output signal. A feedback portion receives the inverter output signal and phase-shifts the inverter output signal to generate an inverter control signal. The feedback portion provides the inverter control signal to the control input of the controlled switch to thereby control switching operations of controlled switch. The driver circuit self-oscillates at or near the resonant frequency due to the feedback portion phase-shifting the inverter output signal to generate the inverter control signal.

In accordance with another aspect of the present invention, provided is a driver circuit for driving a piezoelectric device. The driver circuit comprises an inverter portion that generates a periodic wave. The inverter portion includes a first controlled switch and a second controlled switch. The first controlled switch comprises a first control input for controlling operations of the first controlled switch. The second controlled switch comprises a second control input for controlling operations of the second controlled switch. A tuned circuit portion has a resonant frequency. The tuned circuit portion comprises the piezoelectric device. An inductor is connected to both of the first controlled switch and the second controlled switch. The inductor receives the periodic wave from the inverter portion. At least one capacitor is connected to both of the inductor and the piezoelectric device. The tuned circuit portion receives the periodic wave from the inverter portion and generates a sinusoidal piezoelectric device driving signal from the periodic wave. A frequency of the periodic wave and a frequency of the sinusoidal piezoelectric device driving signal at least substantially equal the resonant frequency of the tuned circuit portion. A feedback portion is connected to both of the first controlled switch and the second controlled switch. The feedback portion comprises a resistor-capacitor network. The feedback portion receives the periodic wave and phase-shifts and shapes the periodic wave to generate an inverter control signal. The feedback portion provides the inverter control signal to both of the first control input of the first controlled switch and the second control input of the second controlled switch to thereby control operations of both of the first controlled switch and the second controlled switch. The driver circuit self-oscillates at or near the resonant frequency due to the feedback portion phase-shifting the periodic wave from the inverter portion to generate the inverter control signal.

In accordance with another aspect of the present invention, provided is a driver circuit for driving a piezoelectric fan. The driver circuit comprises an inverter portion that generates a square wave from a DC input voltage. The inverter portion includes a first field-effect transistor having a first gate and a first source, and a second field-effect transistor having a second gate and a second source. A tuned circuit portion has a resonant frequency. The tuned circuit portion comprises the piezoelectric fan. An inductor is connected to both of the first source of the first field-effect transistor and the second source of the second field-effect transistor. The inductor receives the square wave from the inverter portion. A DC-blocking capacitor is connected in series with the piezoelectric fan and between the inductor and the piezoelectric fan. A smoothing capacitor is connected to the inductor and in parallel with a series combination of the DC-blocking capacitor and the piezoelectric fan. The tuned circuit portion receives the square wave from the inverter portion and generates a piezoelectric fan driving signal from the square wave. A frequency of the square wave and a frequency of the piezoelectric fan driving signal at least substantially equal the resonant frequency of the tuned circuit portion. The tuned circuit portion boosts an RMS voltage of the square wave to generate the piezoelectric fan driving signal such that an RMS voltage level of the piezoelectric fan driving signal is greater than the RMS voltage level of the square wave. A feedback portion is connected to both of the first source of the first field-effect transistor and the second source of the second field-effect transistor, and to both of the first gate of the first field-effect transistor and the second gate of the second field-effect transistor. The feedback portion provides a feedback path from the sources to the gates. The feedback portion comprises said or another inductor connected to a resistor-capacitor network. The resistor-capacitor network both phase-shifts and shapes the square wave from the inverter portion. The driver circuit lacks a tuning potentiometer for adjusting the frequency of the piezoelectric fan driving signal.

DETAILED DESCRIPTION OF THE INVENTION

Figure 1:
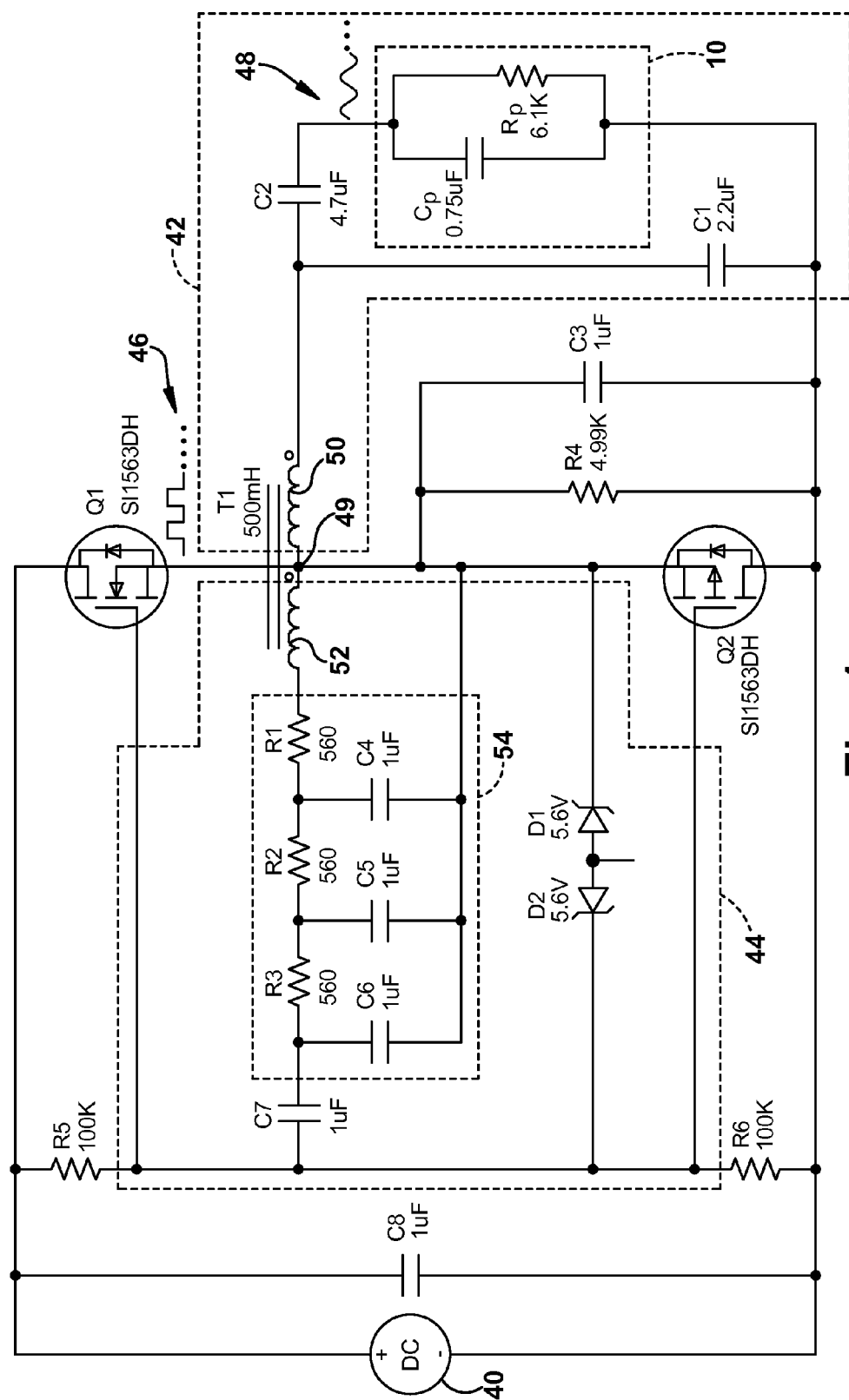
FIG. 1 is a schematic diagram of an example circuit for driving a piezoelectric device.

The present invention relates to driver circuits for resonant loads, such as capacitive or inductive loads. A piezoelectric device is an example capacitive resonant load. In certain embodiments, the resonant load is provided by an air moving device that is part of a resonant tank circuit. Example air moving devices that can be power by the driver circuit discussed below include piezoelectric fans, synthetic jets (SYNJET), and the like.

The present invention will now be described with reference to the drawings, wherein like reference numerals are used to refer to like elements throughout. It is to be appreciated that the various drawings are not necessarily drawn to scale from one figure to another nor inside a given figure, and in particular that the size of the components are arbitrarily drawn for facilitating the understanding of the drawings. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

Figure 2:
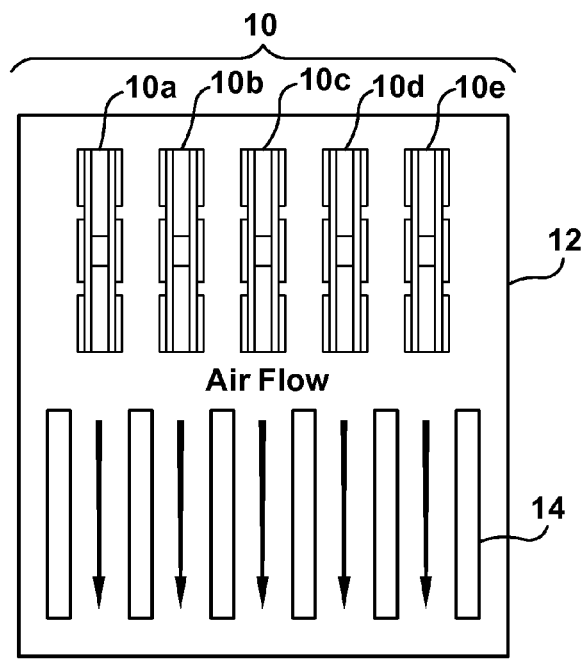
FIG. 2 is a schematic diagram of a heat sink with piezoelectric fans.
Figure 3:
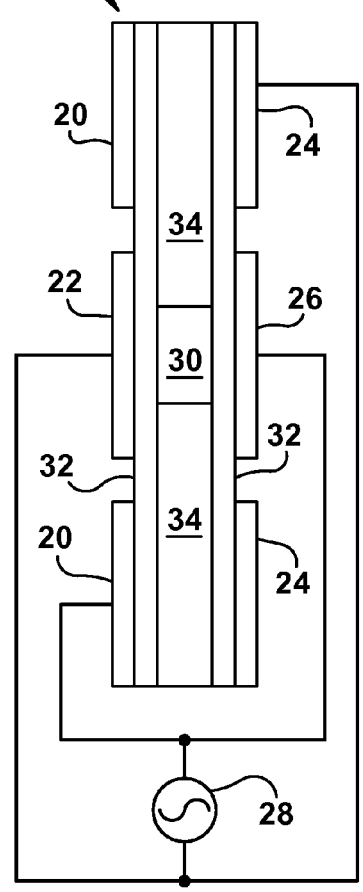
FIG. 3 is a side view of an example piezoelectric fan.
Figure 4:
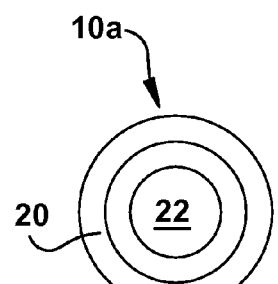
FIG. 4 is an end view of an example piezoelectric fan.

FIG. 1 is a schematic diagram of an example circuit for driving a resonant load, such as a piezoelectric device, at a resonant frequency. The circuit can be used for driving (i.e., supplying power to) one or more air moving devices, such as piezoelectric fans or synthetic jets, to cause the air moving devices to oscillate and move air. FIGS. 2-4 show details of piezoelectric fans, and the use of piezoelectric fans with a heat sink. In FIG. 2, the overall piezoelectric fan 10 comprises a plurality of individual piezoelectric fans 10a-10e. FIG. 2 arbitrarily shows the overall piezoelectric fan 10 as having five individual piezoelectric fans 10a-10e for ease of explanation. It is to be appreciated that the overall piezoelectric fan 10 can include any number of individual fans, such as one individual fan 10a, two individual fans 10a, 10b, more than five individual fans, etc.

The piezoelectric fans 10a-10e are mounted on a heat sink 12 to cool the heat sink. When driven to oscillate, the piezoelectric fans 10a-10e cause airflow across fins 14 of the heatsink12, to cool the heatsink.

An example piezoelectric fan 10a is shown in FIGS. 3 and 4. The fan includes electrodes 20, 22, 24, 26. The electrodes 20, 22, 24, 26 are connected to source 28 that drives the fan 10a to oscillate. It can be seen that the outer electrodes 20, 24 on opposite sides of the fan 10a are connected to the source 28 so as to be out of phase with each other. The inner electrodes 22, 26 are similarly connected. Accordingly, the left and right halves of the fan 10a will oscillate out of phase with each other, causing airflow through a central opening 30 in the fan 10a. The electrodes 20, 22, 24, 26 conduct electrical power from the source 28 to piezoelectric dielectric material 32 in the fan 10a. The piezoelectric dielectric material 32 in the left and right halves of the fan 10a are separated by a spacer, such as a silicon spacer 34.

The individual piezoelectric fans 10a-10e are connected in parallel to the source 28 and are driven by the source.

It is to be appreciated that the piezoelectric fan need not be disc-shaped. For example, a vibrating piezoelectric element can be attached to a fin to cause the fin to vibrate and move air across the heatsink 12.

As noted above, FIG. 1 is a schematic diagram of an example circuit for driving a resonant load, such as a piezoelectric fan, synthetic jet, etc. The driver circuit in FIG. 1 can provide the source 28 shown in FIG. 3.

The overall piezoelectric fan 10 is shown schematically as a parallel resistance-capacitance combination of capacitor $C_p$ and resistor $R_p$. For an overall piezoelectric fan 10 comprising five individual piezoelectric fans 10a-10e (as shown in FIG. 2), an example equivalent parallel resistance-capacitance for the fan 10 can be 6.1 kΩ in parallel with 0.75 µF. The piezoelectric fan can be approximately 3/10 of a Watt, (e.g., 0.29 W).

The driver circuit of FIG. 1 includes an inverter portion for converting a DC source 40 voltage into a periodic inverter output signal. For example, the inverter portion generates a square wave as the periodic inverter output signal. An example DC source voltage is 18 VDC. The inverter portion includes a first field-effect transistor (e.g., n-channel MOSFET) Q1 and a second field-effect transistor (e.g., p-channel MOSFET) Q2. The field-effect transistors Q1 and Q2 each have a gate, source and a drain and act as controlled switches. The switching operations of the field-effect transistors are controlled by an inverter control signal that is applied to both of the gates. The gates act as control inputs for respectively controlling operations of the field-effect transistors.

The field-effect transistors form a Class D inverter and are arranged as a source follower complementary pair. The sources of the transistors Q1 and Q2 are connected to each other. Example field-effect transistors for use as controlled switches in the inverter portion are model SI1563DH available from Vishay Intertechnology, Inc.

The inverter output signal is provided to both a tuned circuit portion 42 and a feedback portion 44. The tuned circuit portion includes an inductor T1, a smoothing capacitor C1 (e.g., 2.2 µF), a DC-blocking capacitor C2 (e.g., 4.7 µF) and the piezoelectric fan 10. The tuned circuit portion 42 has a resonant frequency when the piezoelectric device 10 is connected to it. The driver circuit of FIG. 1 self-oscillates at or near (e.g., within 10% of) the resonant frequency to drive the piezoelectric fan. An example resonant frequency of the tuned circuit portion is 120 Hz. Since the driver circuit self-oscillates at or near the resonant frequency, the driver circuit does not need to be manually tuned to accommodate the fan. Accordingly, the driver circuit lacks an analog or digital tuning or trimming potentiometer for adjusting the frequency of the driving signal supplied to the fan 10 or for adjusting the frequency of the square wave from the inverter portion.

It can be desirable to design the driver circuit and piezoelectric fan combination such that the resonant frequency of the tuned circuit portion 42 is outside of the threshold of human hearing, so that the fan operates quietly.

The inverter portion outputs a square wave 46 to the tuned circuit portion 42. A capacitor C3 (e.g., 1 µF) reduces the bandwidth of the square wave by reducing the slopes of the edges of the square wave. The capacitor C3 conducts high-frequency components of the square wave away from the inductor T1 to reduce potential acoustic noise from the piezoelectric fan 10.

The tuned circuit portion 42 converts the output signal from the inverter portion into a substantially sinusoidal piezoelectric device driving signal 48 having the resonant frequency (e.g., 120 Hz) or having a frequency substantially equal to the resonant frequency. Both the output signal from the inverter and the piezoelectric device driving signal 48 have a frequency that is at least substantially equal to the resonant frequency (i.e., equal to or substantially equal to the resonant frequency).

The DC-blocking capacitor C2 blocks the DC component from the piezoelectric device driving signal. The total harmonic distortion (THD) of the driving signal 48 can be low, such as less than 2%, or about 1% for example. The tuned circuit portion 42 can inherently boost the inverter output signal to a higher RMS voltage level due to the tuned circuit portion being driven near its resonant frequency. For example, the tuned circuit portion 42 might boost the inverter output signal from 10 V to 42 V RMS.

In the tuned circuit portion, the inductor T1 is directly connected to the sources of the field-effect transistors Q1, Q2. In FIG. 1, the inductor T1 has a tap 49 that forms a first winding 50 and a second winding 52. The first winding 50 (e.g., 500 mH) is part of the tuned circuit portion 42, and the second winding 52 is part of the feedback portion 44. The inductor T1 is connected to the field-effect transistors Q1, Q2 at the tap 49. The first and second windings 50, 52 are mutually coupled with a high coupling coefficient. For example, the coupling coefficient can be greater than 0.95, such as approximately 0.98. It is to be appreciated that separate inductors could be used in the tuned circuit portion 42 and the feedback portion 44, rather than a tapped inductor, provided that a high coupling coefficient is achieved.

The DC blocking capacitor C2 is connected in series with the piezoelectric fan 10, between the inductor T1 and the fan. The smoothing capacitor C1 is connected to the inductor T1 and to the DC-blocking capacitor C2 and is electrically in parallel with the series combination of: (a) the DC-blocking capacitor and (b) the piezoelectric fan.

In addition to the second winding 52 of the inductor T1, the feedback portion 44 includes a resistor-capacitor (RC) network 54 connected to the second winding 52. Thus, the second winding 52 is connected between the tap 49 and the RC network 54. The RC network includes a plurality of low-pass filters formed by resistors R1, R2, R3 (e.g., 560Ω) and capacitors C4, C5, C6 (e.g., 1 μF). The RC network phase-shifts and shapes the output signal from the inverter portion into a generally sinusoidal waveform, to generate the inverter control signal that is provided to both of the gates of the transistors Q1, Q2. The feedback portion 44 provides a feedback path from the sources of the transistors Q1, Q2 to their gates. The RC network in the feedback portion 44 allows the driver circuit to self-oscillate at or near the resonant frequency.

The RC network 54 is a phase-shifting portion within the driver circuit and is driven by the second winding 52. The tapped inductor T1 essentially forms a pair of mutually coupled inductors, wherein the tap voltage is a fraction of the voltage developed across the 500 mH inductor. The coupling coefficient can be approximately 0.98, so that the tapped inductor operates like an autotransformer, generating a fraction of the 500 mH inductor voltage at the input to the RC network 54. The RC network 54 provides a phase shift of 90 degrees or approximately 90 degrees. The phase shift provided by the RC network 54 can be other than 90 degrees, e.g., slightly less than 90 degrees, but the phase shift should be sufficient enough to operate the tuned circuit portion 42 with the piezoelectric device 10 at the resonant frequency.

The feedback portion 44 includes Zener diodes D1, D2 (e.g., 5.6 V) that limit the peak voltage supplied by the feedback portion 44 to the gates of the transistors Q1, Q2. The Zener diodes D1, D2 can serve to "clip" the voltage peaks of the inverter control signal fed back to the gates of the transistors Q1, Q2.

The feedback portion 44 includes DC-blocking capacitor C7 (e.g., 1 μF). The DC-blocking capacitor C7 is connected between the plurality of low-pass filters formed by the RC network 54 and the gates of the transistors Q1, Q2. The DC-blocking capacitor C7 allows transistor Q1 to initially turn on when power is applied to the driver circuit, to start the driver circuit oscillating.

The driver circuit includes a resistor R4 (e.g., 4.99 kΩ) that is connected electrically in parallel with capacitor C3, across the second field-effect transistor Q2. Resistor R4 helps to start the driver circuit oscillating.

The driver circuit includes resistor R5 (e.g., 100 kΩ) connected between the drain and gate of transistor Q1, and resistor R6 (e.g., 100 kΩ) connected between the drain and gate of transistor Q2. The driver circuit further includes capacitor C8 (e.g., 1 μF) connected across the DC source 40 for conducting any high-frequency noise back to the DC source.

It is to be appreciated that the size of the components shown in FIG. 1 and discussed herein are example sizes provided to facilitate an understanding of the example embodiments. The size of the components (e.g., their values in Ω, H, F, etc.) can be changed to various different sizes. For example, the size of various components can be determined based on the electrical characteristics of a specific resonant load to be driven, the desired resonant frequency of the tuned circuit portion, etc.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A driver circuit for driving a resonant load, comprising:
    an inverter portion that generates an inverter output signal, the inverter portion comprising a controlled switch, wherein the controlled switch comprises a control input for controlling switching operations of the controlled switch;
    a tuned circuit portion having a resonant frequency when connected to the resonant load,
        wherein the tuned circuit portion receives the inverter output signal and generates a resonant load driving signal from the inverter output signal,
        wherein a frequency of the inverter output signal and a frequency of the resonant load driving signal at least substantially equal the resonant frequency of the tuned circuit portion, and
        wherein the tuned circuit portion boosts the inverter output signal to generate the resonant load driving signal such that an RMS voltage level of the resonant load driving signal is greater than an RMS voltage level of the inverter output signal;
    a feedback portion that receives the inverter output signal and phase-shifts the inverter output signal to generate an inverter control signal, wherein the feedback portion provides the inverter control signal to the control input of the controlled switch to thereby control switching operations of controlled switch, and
    wherein the driver circuit self-oscillates at or near the resonant frequency due to the feedback portion phase-shifting the inverter output signal to generate the inverter control signal.

2. The driver circuit of claim 1, wherein the inverter portion comprises a second controlled switch comprising a second control input for controlling operations of the second controlled switch, wherein the first controlled switch and the second controlled switch form a Class-D inverter, and wherein the feedback portion provides the inverter control signal to the second control input of the second controlled switch to thereby control switching operations of the second controlled switch.

3. The driver circuit of claim 2, further comprising an inductor having a tap thereby forming a first winding and a second winding, wherein the inductor is connected to both of the first controlled switch and the second controlled switch at the tap, and wherein the first winding is a part of the tuned circuit portion and the second winding is a part of the feedback portion.

4. The driver circuit of 1, wherein the driver circuit lacks a tuning potentiometer for adjusting the frequency of the resonant load driving signal.

5. The driver circuit of claim 1, wherein the tuned circuit portion comprises:
   an inductor that receives the inverter output signal;
   a DC-blocking capacitor connected in series with the resonant load and between the inductor and the resonant load; and
   a smoothing capacitor connected to the inductor and in parallel with a series combination of the DC-blocking capacitor and the resonant load.

6. The driver circuit of claim 5, wherein the inverter portion comprises a second controlled switch comprising a second control input for controlling operations of the second controlled switch,
   wherein the feedback portion provides the inverter control signal to the second control input of the second controlled switch to thereby control switching operations of the second controlled switch,
   the driver circuit further comprising:
   a resistor and a further capacitor that are connected in parallel across the second controlled switch.

7. The driver circuit of claim 1, wherein the resonant load is a piezoelectric fan.

8. A driver circuit for driving a piezoelectric device, comprising:
   an inverter portion that generates a periodic wave, the inverter portion comprising a first controlled switch and a second controlled switch, wherein the first controlled switch comprises a first control input for controlling operations of the first controlled switch, and wherein the second controlled switch comprises a second control input for controlling operations of the second controlled switch;
   a tuned circuit portion having a resonant frequency, the tuned circuit portion comprising:
     the piezoelectric device,
     an inductor connected to both of the first controlled switch and the second controlled switch, the inductor receiving the periodic wave from the inverter portion;
     at least one capacitor connected to both of the inductor and the piezoelectric device;
     wherein the tuned circuit portion receives the periodic wave from the inverter portion and generates a sinusoidal piezoelectric device driving signal from the periodic wave,
     wherein a frequency of the periodic wave and a frequency of the sinusoidal piezoelectric device driving signal at least substantially equal the resonant frequency of the tuned circuit portion, and
   a feedback portion connected to both of the first controlled switch and the second controlled switch, wherein the feedback portion comprises a resistor-capacitor network, the feedback portion receiving the periodic wave and phase-shifting and shaping the periodic wave to generate an inverter control signal, wherein the feedback portion provides the inverter control signal to both of the first control input of the first controlled switch and the second control input of the second controlled switch to thereby control operations of both of the first controlled switch and the second controlled switch,
   wherein the driver circuit self-oscillates at or near the resonant frequency due to the feedback portion phase-shifting the periodic wave from the inverter portion to generate the inverter control signal.

9. The driver circuit of claim 8, wherein the tuned circuit portion boosts the periodic wave from the inverter portion to generate the sinusoidal piezoelectric device driving signal such that an RMS voltage level of the sinusoidal piezoelectric device driving signal is greater than an RMS voltage level of the periodic wave from the inverter portion.

10. The driver circuit of claim 8, wherein the driver circuit lacks a tuning potentiometer for adjusting the frequency of the sinusoidal piezoelectric device driving signal.

11. The driver circuit of claim 8, wherein the inductor is tapped thereby forming a first winding and a second winding, wherein the inductor is connected to both of the first controlled switch and the second controlled switch at the tap, wherein the first winding is a part of the tuned circuit portion and the second winding is a part of the feedback portion, and wherein the second winding is connected between the resistor-capacitor network and the tap.

12. The driver circuit of claim 8, wherein the at least one capacitor comprises a DC-blocking capacitor connected in series with the piezoelectric device and between the inductor and the piezoelectric device, and a smoothing capacitor connected to the inductor and in parallel with a series combination of the DC-blocking capacitor and the piezoelectric device.

13. The driver circuit of claim 8, wherein the resistor-capacitor network comprises a plurality of low-pass filters, the driver circuit further comprising:
    a resistor and a further capacitor that are connected in parallel across the second controlled switch.

14. A driver circuit for driving a piezoelectric fan, comprising:
    an inverter portion that generates a square wave from a DC input voltage, the inverter portion comprising a first field-effect transistor having a first gate and a first source, and a second field-effect transistor having a second gate and a second source;
    a tuned circuit portion having a resonant frequency, the tuned circuit portion comprising:
      the piezoelectric fan;
      an inductor connected to both of the first source of the first field-effect transistor and the second source of the second field-effect transistor;
      a DC-blocking capacitor connected in series with the piezoelectric fan and between the inductor and the piezoelectric fan; and
      a smoothing capacitor connected to the inductor and in parallel with a series combination of the DC-blocking capacitor and the piezoelectric fan,
      wherein the tuned circuit portion generates a piezoelectric fan driving signal,
      wherein a frequency of the square wave and a frequency of the piezoelectric fan driving signal at least substantially equal the resonant frequency of the tuned circuit portion, and
      wherein the tuned circuit portion boosts an RMS voltage of the square wave to generate the piezoelectric fan driving signal such that an RMS voltage level of the piezoelectric fan driving signal is greater than the RMS voltage level of the square wave;
    a feedback portion connected to both of the first source of the first field-effect transistor and the second source of the second field-effect transistor, and to both of the first gate of the first field-effect transistor and the second gate of the second field-effect transistor, the feedback portion providing a feedback path from the sources to the gates, wherein the feedback portion comprises said or another inductor connected to a resistor-capacitor network, and wherein the resistor-capacitor network both phase-shifts and shapes the square wave from the inverter portion, and wherein the driver circuit lacks a tuning potentiometer for adjusting the frequency of the piezoelectric fan driving signal.

15. The driver circuit of claim 14, wherein the driver circuit self-oscillates at or near the resonant frequency.

16. The driver circuit of claim 14, further comprising a resistor and a further capacitor that are connected in parallel across the second field-effect transistor.

17. The driver circuit of claim 14, wherein the resistor-capacitor network comprises a plurality of low-pass filters.

18. The driver circuit of claim 14, wherein the feedback portion comprises another DC-blocking capacitor, and wherein the another DC-blocking capacitor is connected between the plurality of low-pass filters and said gates.

19. The driver circuit of claim 18, wherein the feedback portion includes at least one Zener diode for limiting a peak voltage supplied by the feedback portion to said gates.

20. The driver circuit of claim 14, wherein the inductor is tapped such that a portion of said inductor forms a part of the tuned circuit portion and another portion of said inductor forms a part of the feedback portion.

\* \* \* \* \*